(12) United States Patent
Bickel et al.

(10) Patent No.: US 7,639,129 B2
(45) Date of Patent: Dec. 29, 2009

(54) AUTOMATED CONFIGURATION OF A POWER MONITORING SYSTEM USING HIERARCHICAL CONTEXT

(76) Inventors: Jon Andrew Bickel, 3123 Monarch Dr., Murfreesboro, TN (US) 37129; Ronald W. Carter, 490 Fortress Blvd., Apt. 13G, Murfreesboro, TN (US) 37128; Larry E. Curtis, 118 Marauder Ct., Murfreesboro, TN (US) 37129

(*) Notice: Subject to any disclaimer, the term of this patent is extended or adjusted under 35 U.S.C. 154(b) by 323 days.

(21) Appl. No.: 11/900,262

(22) Filed: Sep. 11, 2007

(65) Prior Publication Data
US 2009/0066528 A1   Mar. 12, 2009

(51) Int. Cl.
*G08B 29/00* (2006.01)
*G08B 23/00* (2006.01)
*G05D 3/12* (2006.01)

(52) U.S. Cl. .............. 340/506; 340/508; 340/511; 340/521; 340/522; 340/538; 340/525; 340/657; 700/22; 700/291

(58) Field of Classification Search ............. 340/506, 340/508, 522, 523
See application file for complete search history.

(56) References Cited

U.S. PATENT DOCUMENTS

| | | | | |
|---|---|---|---|---|
| 7,020,701 B1 * | 3/2006 | Gelvin et al. | ............... | 709/224 |
| 7,034,701 B1 * | 4/2006 | Rose-Pehrsson et al. | .... | 340/628 |
| 2005/0273861 A1 * | 12/2005 | Chess et al. | ................ | 726/25 |
| 2007/0005275 A1 | 1/2007 | Bickel et al. | ................ | 702/60 |
| 2007/0005277 A1 | 1/2007 | Bickel et al. | ................ | 702/61 |
| 2007/0014313 A1 | 1/2007 | Bickel et al. | ................ | 370/503 |

FOREIGN PATENT DOCUMENTS

WO   WO 2006/102172 A2   9/2006

OTHER PUBLICATIONS

Written Opinion corresponding to co-pending International Patent Application Serial No. PCT/US2008/075833, European Patent Office, dated Jul. 14, 2009, 8 pages.
International Search Report corresponding to co-pending International Patent Application Serial No. PCT/US2008/075833, European Patent Office, dated Jul. 14, 2009, 5 pages.

* cited by examiner

*Primary Examiner*—Donnie L Crosland

(57) ABSTRACT

Methods of automatically configuring a power monitoring system based upon the locations of the monitoring devices in a hierarchy representing the spatial interrelationships of the monitoring devices. The power monitoring system includes a host computer communicatively coupled to a plurality of monitoring devices arranged in a hierarchy in an electrical system. Software on the host computer may execute any or all of an alarm aggregation algorithm for aggregating multiple alarms based on device location; a feature distribution algorithm for enabling/disabling selected device features; an evaluation algorithm for evaluating device applications; a device check algorithm for detecting flawed data; a custom configuration algorithm for customized configuration of thresholds on device-by-device basis; a host computer configuration algorithm for configuring the host computer; a redundancy algorithm for verifying an electrical event; an alarm configuration algorithm for configuring device thresholds; and a configuration error checking algorithm for detecting nomenclature issues.

14 Claims, 11 Drawing Sheets

AUTOMATED CONFIGURATION OF A POWER MONITORING SYSTEM USING HIERARCHICAL CONTEXT

FIELD OF THE INVENTION

The present invention relates generally to utility systems, and, in particular, to a method for automatically configuring a power monitoring system based upon the hierarchical relationship of the monitoring devices with respect to the power monitoring system, which is part of an electrical system.

BACKGROUND OF THE INVENTION

Configuring a power monitoring system requires the user to setup each monitoring device (and its associated software) on an discrete basis, a task that necessitates an understanding of each monitoring device's capabilities. The user must also evaluate each monitoring device with respect to its location in a hierarchically organized power monitoring system. Furthermore, the user must understand each monitoring device's application to properly configure alarming thresholds, data logging requirements, etc. Finally, the user must configure the power monitoring system software to accommodate each specific device.

Typically, the user configures the monitoring devices with generic templates, which may not meet the requirements of the power monitoring system. For example, one monitoring device located on the main electrical switchgear may require EN50160 or flicker features to be configured, while another monitoring device at a motor load may require NEMA thresholds to be configured.

Presently, appropriately installing, configuring, and commissioning the power monitoring devices and software often require more than one day. It also requires familiarity with the power monitoring system and the specific electrical system to which it is being applied. Furthermore, in every case, service providers have to devote a substantial amount of time to analyze the monitoring system and the application to confirm proper configuration.

What is needed, therefore, is a method of automatically configuring monitoring devices in a power monitoring system based upon the known location of the monitoring devices within the hierarchical power monitoring system. Aspects of the present invention address these and other needs.

SUMMARY OF THE INVENTION

Briefly, according to an embodiment of the present invention, various automated configuration methods are disclosed that are based upon at least the spatial positions of monitoring devices within a known hierarchy of an electrical system. Their configurations can be dependent upon their positions relative to other monitoring devices or a particular load or their approaching or exceeding a setpoint threshold associated with an electrical characteristic.

Using the knowledge of the location of a monitoring device within the context of a hierarchically organized power monitoring system can provide many benefits that are currently unavailable in existing power monitoring systems. While minimizing or in many cases eliminating user intervention, aspects of the present invention efficiently and appropriately configures and verifies a power monitoring system based upon each monitoring device's location within the monitoring system. Aspects of the present invention also increase the short-term and long-term operational effectiveness of both discrete monitoring devices and the power monitoring system as a whole. Furthermore, aspects of the present invention automatically detect and notify the end-user of erroneous configurations, potential safety considerations, misapplications of monitoring devices (with recommendations), monitoring device malfunctions, and other issues that may otherwise go unnoticed.

Providing end-users with a more automated "plug-and-play" method of configuring and verifying the power monitoring system can save time, reduce costs, and improve safety. Aspects disclosed herein can lengthen the time between hardware design cycles and improve customer satisfaction.

The foregoing and additional aspects of the present invention will be apparent to those of ordinary skill in the art in view of the detailed description of various embodiments, which is made with reference to the drawings, a brief description of which is provided next.

BRIEF DESCRIPTION OF THE DRAWINGS

The foregoing and other advantages of the invention will become apparent upon reading the following detailed description and upon reference to the drawings.

Figure 1:
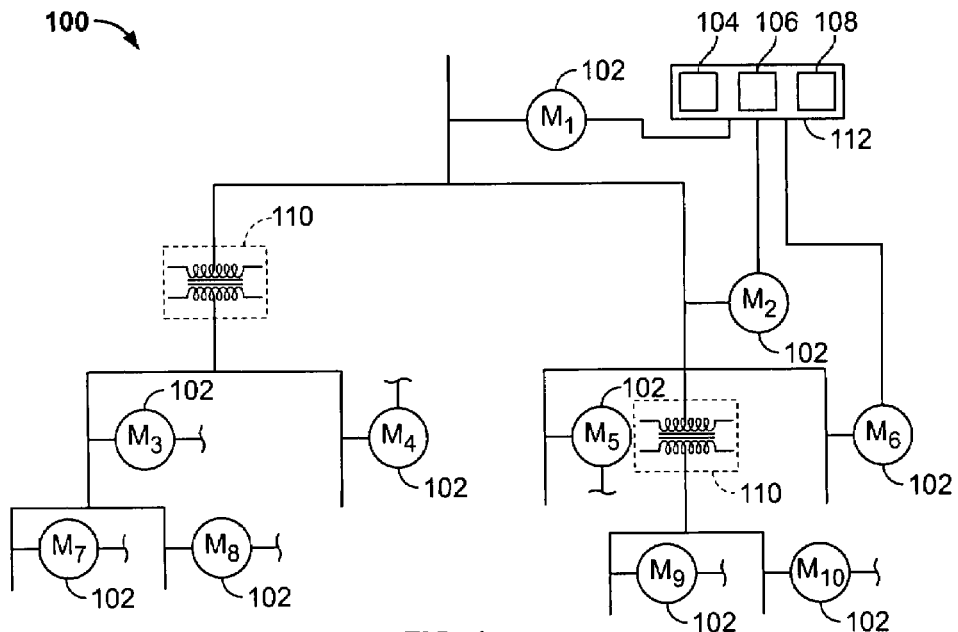
FIG. 1 illustrates a functional block diagram of an exemplary power monitoring system comprising a plurality of monitoring devices in a hierarchical arrangement.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION OF THE ILLUSTRATED EMBODIMENTS

Turning now to FIG. 1, a power monitoring system 100 having two or more monitoring devices 102 (labeled M) providing characterized data from each discrete location. As used herein, a monitoring device refers to any system element or apparatus with the ability to sample, collect, and/or measure one or more electrical characteristics or operational parameters of a utility system. The power monitoring system 100 is part of an electrical system that includes the monitoring devices 102. By "power" in the term power monitoring system, it is meant to include power, voltage, current, frequency, or other electrical characteristics that can be used to determine and characterize the electrical system hierarchy. In some aspects, the data from each monitoring device 102 is communicated to an automated data alignment module 104, an automated hierarchy classification module 106 and an automated configuration module 108. These systems can be implemented as algorithms on a computer-readable medium residing in a host computer 112. The data is temporally (or pseudo-temporally) aligned automatically in the automated data alignment module 104, which produces data that is sensed simultaneously (or nearly simultaneously for the pseudo-temporal alignment case) by each of the monitoring devices 102 in the power monitoring system 100. The hierarchy classification module 106 automatically learns the hierarchy of the monitoring devices 102 present in the power monitoring system 100 and their spatial relationships within the power monitoring system relative to one another. It should be noted that some or all of the monitoring devices 102 shown in FIG. 1 can be bi-directionally communicatively coupled to the host computer 112. Only several representative bidirectional communication links and monitoring devices are shown for the sake of clarity, though it is understood that more (all or less than all) or fewer monitoring devices can be communicatively coupled to the host computer 112.

Each monitoring device 102 measures (samples, collects, etc.) data from the power monitoring system 100, and quantifies this data into characteristics that may be analyzed by a computer or analysis system. In this example, the monitoring devices 102 may be based on a PowerLogic® Series 3000/4000 Circuit Monitor or a PowerLogic® ION7550/7650 Power and Energy Meter available from Schneider Electric or any other suitable monitoring device such as a circuit breaker, a relay, a metering device, or a power meter. There may also be multiple monitoring devices with the capabilities of the monitoring device 102 in the power monitoring system 100. For the sake of simplicity, only a few monitoring devices 102 are shown coupled to the automated data alignment system 104, the automated hierarchy classification module 106 and the automated configuration module 108, though it is understood that all the monitoring devices 102 in FIG. 1 may be in communications with the modules 104, 106 and 108. Further, the multiple monitoring devices 102 may be in communication with other types of analysis or evaluation systems to monitor the performance of the power monitoring system 100.

The data alignment module 104 aligns data, such as voltage, current, events, and the like, from the multiple monitoring devices 102 in the power monitoring system 100. When data from all the monitoring devices 102 is aligned to the same point (or approximately the same point based on pseudo-temporal alignment) in time that the data occurred, the data can be put into a temporal or pseudo-temporal context from which additional decisions regarding hardware and software configuration can be automatically made or recommended. Of course it is to be understood, that the data alignment module 104 may be a desirable option, but the power monitoring system 100 may be monitored without the data alignment module 104. Alignment without the data alignment module 104 may be carried out with a global positioning system (GPS) or other time-alignment system.

The measured data from various meters may be synchronized or approximately synchronized with each other within a temporal or pseudo-temporal context. Temporal alignment is more precise than pseudo-temporal alignment. Pseudo-temporal alignment takes data within an acceptable range based on load changes in the system. One example of a pseudo-temporal alignment system utilizes a network time protocol (NTP) for clock synchronization. Automatic temporal alignment implementations are described in U.S. patent application Ser. No. 11/174,099, filed Jul. 1, 2005, entitled "Automated Precision Alignment of Data in a Utility Monitoring System."

The hierarchy classification module 106 characterizes the electrical system layout of the power monitoring system 100, which is essential to understanding and characterizing the power monitoring system 100, which is part of an electrical system. The module 106 characterizes how the monitoring devices in the power monitoring system 100 are connected to one another. Monitoring devices typically provide only the electrical system's operating parameters, but do not provide information on how the parameters at different monitoring points on the electrical system relate to each other spatially. Having the hierarchy of an electrical system puts the operating parameters of multiple monitoring devices into spatial context with each other. This spatial context gives the user a more powerful tool to configure the devices 102 in the power monitoring system 100. Automated hierarchy classification implementations are described in U.S. patent application Ser. No. 11/174,100, filed Jul. 1, 2005, entitled "Automated Hierarchy Classification in Utility Monitoring Systems," the entirety of which is incorporated herein by reference.

The hierarchy classification module 106 includes monitoring system software that collects data from the monitoring devices 102 on the power monitoring system 100 and automatically determines the hierarchy of the power monitoring system 100 with little or no user input. The level of detail given by the hierarchy classification module 106 correlates with the number and extent of monitoring devices 102 in the power monitoring system 100. As additional monitoring devices are added, the auto-learned hierarchical algorithm automatically incorporates them into the determined hierarchical structure. It is to be understood that other processes such as preloading hierarchy data that has been manually determined to the analysis and evaluation systems may be used in place of a dedicated hierarchy system such as the hierarchy classification module 106.

In the case of a power system hierarchy, an objective is to order devices in the power monitoring system so as to represent the true connection layout of the power monitoring system as it relates to the electrical system. Determining the hierarchy of a power monitoring system provides important information that can be used to solve problems, increase equipment and system performance, improve safety, facilitate the installation, configuration, or commissioning of the devices 102, and save money. The level of detail in a power system hierarchy will depend on both the number of elements 102 or nodes that are being monitored and the node's ability to provide feedback to the auto-learned hierarchy algorithm in the monitoring system software running on the module 106.

Generally, the hierarchy classification module 106 utilizes an auto-learned hierarchy algorithm in the monitoring system software that is based on rules and statistical methods. Periodically, the monitoring system software polls each monitoring device 102 in the power monitoring system 100 to determine certain characteristics or parameters of the power monitoring system 100 at that node (represented by a monitoring device). Multiple samples of specified parameters are taken from each monitoring device in the power monitoring system 100 at the same given point in time. Once a time-series of the parameter data is collected from each monitoring device in the power monitoring system 100, the hierarchy classification module 106 analyzes the data and identifies the relationships or links among the monitoring devices 102 with respect to the time the data sample was taken and the associated value of the data sample. This analysis may be performed periodically to increase the probability that the hierarchy is accurate, or to ascertain any changes in the hierarchy. It may also be performed if the monitoring system software detects the addition of a new element or node to the power monitoring system. Once this iterative process reaches some predetermined level of statistical confidence that the determined layout of the power monitoring system 100 is correct, the auto-learned hierarchy algorithm ends. The final layout of the power monitoring system 100 may be presented to the user for concurrence. As each monitoring device's data is evaluated over time (the learning period) with respect to all other capable monitoring devices using the auto-learned hierarchy algorithm, a basic layout of the hierarchical structure of the power monitoring system 100 is determined based on the monitoring points available.

Figure 2:
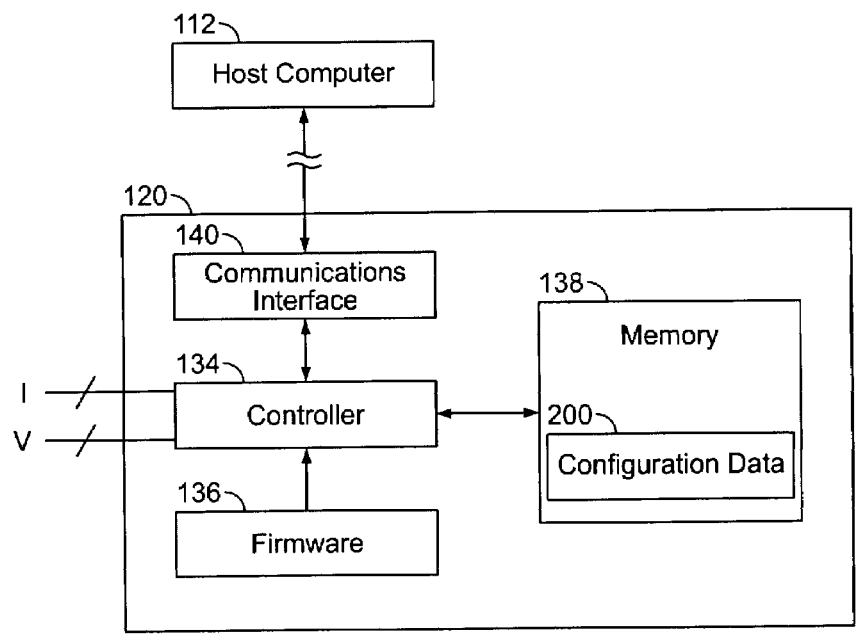
FIG. 2 is a functional bock diagram of an exemplary monitoring device communicatively coupled to a host computer shown in FIG. 1.

In FIG. 2, an exemplary monitoring device 102 is shown. It includes a controller 134 to which one or more current and voltage lines are coupled, firmware 136 holding machine instructions for controlling the operation and functionality of the monitoring device 102, a memory 138 that stores, among other things, configuration data 200 and is coupled to the controller 134, and a communications interface 140 that is communicatively coupled to the host computer 112. The configuration data 200 includes information that configures the monitoring device 102 for proper operation in the power monitoring system 100. Examples of configuration data 200 include any one or more of a feature library (e.g., which device features should be enabled or disabled), pickup and dropout alarm thresholds, user preferences, types of data to log (e.g., energy-related data), and other device setup information. Examples of alarm thresholds include voltage thresholds (e.g., root-mean-square (RMS) values, harmonic components, total harmonic distortion), transient thresholds, and current thresholds (e.g., RMS values, harmonic components, total harmonic distortion). Other data that can be stored in the memory 138 includes codes, electrical standards, an equipment information library, default conditions, and firmware version.

Knowledge of the hierarchy of the power monitoring system 100 in conjunction with data measured from the monitoring points makes the power monitoring system 100 greater than the sum of its parts. This is achievable by knowing the context of each discrete monitoring device within the scope of the power monitoring system 100.

System Installation, Configuration, and Commissioning

Aspects of the present invention disclosed herein facilitate one or more of at least three aspects relating to a power monitoring system 100: system installation, configuration, and commissioning. Characterizing the power monitoring system 100 over an extended time period will allow for a more suitable configuration of the power monitoring system 102 with respect to its loads (not shown). Aspects of the present invention learn what is "normal" based on the data from multiple monitoring devices 102, and adjust various thresholds and configurations as required. Dramatic changes in the electrical system or power monitoring system 100 may be flagged and the end-user notified.

Aspects of the present invention evaluate signals that are present on the power monitoring system 100 to determine the effectiveness of a given monitoring device or devices. For example, if signals with high frequency components that exist near the Nyquist frequency, then a monitoring device utilizing an anti-aliasing filter or a higher sampling rate might be recommended.

Each monitoring device 102 may be different, and aspects of the present invention can account for the uniqueness of discrete monitoring devices 102. For example, if a monitoring device 102 has on-board logging capabilities, then software 108 according to aspects of the present invention configures the on-board logs appropriately. However, if a monitoring device does not incorporate on-board logging, then the software 108 would self-configure to provide computer-based logging as required.

There are many different aspects of installation, configuration, and commissioning that are contemplated as falling within the scope of aspects described herein, including: alarming, logging, waveform capturing, I/O, security, wiring deficiencies and errors, contextual feature enablement, safety, device validation, firmware validation, software configuration, and so forth.

Benefits realized during installation, configuration, and commissioning include:

Saving time and money due to quicker commissioning of power monitoring systems.

Quickly identifying potential problems with an installation of a monitoring device.

Quickly identifying improper applications of discrete monitoring devices.

Insuring all discrete monitoring devices are appropriately configured.

Reducing configuration errors and improving the consistency in installation and configuration of the monitoring devices.

Customizing discrete monitoring devices to their assigned monitoring task.

System Operation

Power monitoring systems 100 are rarely static, and may not be used to their fullest potential if periodic adjustments are not made. Furthermore, the end-user may not have the time or information to make these periodic adjustments to the power monitoring system 100. Aspects of the present invention would either make the appropriate adjustments automatically or notify the end-user of existing discrepancies or inefficiencies.

A permanently installed power monitoring system 100 according to aspects disclosed herein provides the end-user with many benefits, even after commissioning the monitoring system 100. Because data from each monitoring device 102 is evaluated within a contextual framework, the confidence in feedback from the power monitoring system 100 is greatly increased and enhanced because data from one monitoring device 102 can be substantiated by one or more other monitoring devices 102 based on their location in the power monitoring system hierarchy.

Any modification to the power monitoring system 100 by adding, removing, or moving a discrete device(s) 102 is determined. Additional monitoring devices are automatically configured based on their location within the hierarchy. The removal of a monitoring device 102 is logged, and the end-user notified. Moving a monitoring device 102 from one point in the hierarchy to another point is logged, and the moved monitoring device 102 is reconfigured accordingly and in context with its new location in the hierarchy. Aspects of the present invention can also make recommendations for installing, removing, and/or moving a monitoring device or devices 102 in order to make the power monitoring system 100 more efficient and effective.

Because the power monitoring system 100 is evaluated from a contextual perspective, the amount of data (as seen by the end-user) can be substantially reduced. System alarms are relatively simple to incorporate, thereby reducing the number of events up to the same order as the number of meters on the monitoring system. Problems that would normally be flagged as a discrete event from each discrete devices would be flagged as a single event from all devices that captured the event, thus consolidating the event into a single alarm.

An end-user may have certain concerns that outweigh others. For example, energy usage and conservation may be more important than the level of power quality within a specific facility. The end-user can prioritize the monitoring system 100 to focus on some specific electrical characteristics over others, and be notified accordingly.

The operational health of the power monitoring system 100 can be evaluated in real time. Discrete monitoring devices 102 that are malfunctioning, or misapplied can be noted, and the end-user quickly notified. Discrete devices 102 can also be provided with firmware updates from the host computer 112 as they become available.

Benefits of the automatic configuration aspects herein to a power monitoring system include:
- Improving the veracity of, and confidence in, answers and suggestions as a result of the contextual redundancy of the monitoring devices in the power monitoring system.
- Simplifying the addition of new monitoring devices, and the relocation of existing monitoring devices, without requiring tedious manual configuration or reconfiguration.
- Minimizing and simplifying the data generated by the power monitoring system to be reviewed by the end-user, reducing confusion and avoiding overwhelming the end-user with data that may be redundant or even inaccurate due to manual commissioning or configuration errors.
- Quickly notifying the end-user of malfunctioning, or misapplied monitoring devices.

Safety

Another important feature of certain aspects of the present invention is automatic notification to the end-user of some safety-related considerations. A power monitoring system 100 may show one phase notation (e.g., A,B,C) in a first discrete device 102, and show a different phase notation (e.g., B,C,A) in a second device 102 that is linked with the first discrete device 102. Both devices 102 have the same phase rotation, but are labeled differently. This labeling difference may cause confusion when determining whether a specific phase is energized or not. The software executed by the host computer 112 determines whether phase nomenclature issues exist based upon the spatial relationships of the monitoring devices in the hierarchy, and can correct the improper installation based on the end-user's preference. This also helps eliminate confusion of which phase an event occurred on by making the phase labels uniform across the system.

Once the hierarchy of the power monitoring system 100 is determined, a first monitoring device is selected and its electrical data for phase A is determined. A second monitoring device that is linked to the first monitoring device is then selected, and correlation algorithms are carried out to determine which phase A, B, or C of the second monitoring device has the highest correlation with the data associated with phase A of the first monitoring device. If the highest correlation returns phase A for the second monitoring device, the software on the host computer 112 determines that phase A is labeled correctly on both devices. Otherwise, the software on the host computer 112 proceeds to compare phase B of the first monitoring device against all the phases of the second monitoring device to determine the highest correlation factor. Finally, the software on the host computer 112 compares phase C of the first monitoring device against all phases of the second monitoring device to determine the highest correlation factor. In short, a time-series data set is collected for each phase on both meters. A-phase on the first meter is correlated with the A, B, and C phases on the second meter to determine which has the highest correlation. The one with the highest correlation is selected as the match. The B-phase on the first meter is then correlated with the A, B, and C phases on the second meter to determine the highest correlation. The one with the highest correlation is determined to be a match. Phase C on the first meter is correlated with the A, B, and C phases on the second meter to determine the highest correlation. The one with the highest correlation is determined to be a match. If there is any discrepancy in the results, a process of elimination is performed by selecting the phases from each meter with the highest overall correlation and choosing those phases as a match. The next highest correlation is chosen on the remaining phases between both meters as a match. The final phase from each meter is selected as a match based on the process of elimination.

Figure 12:
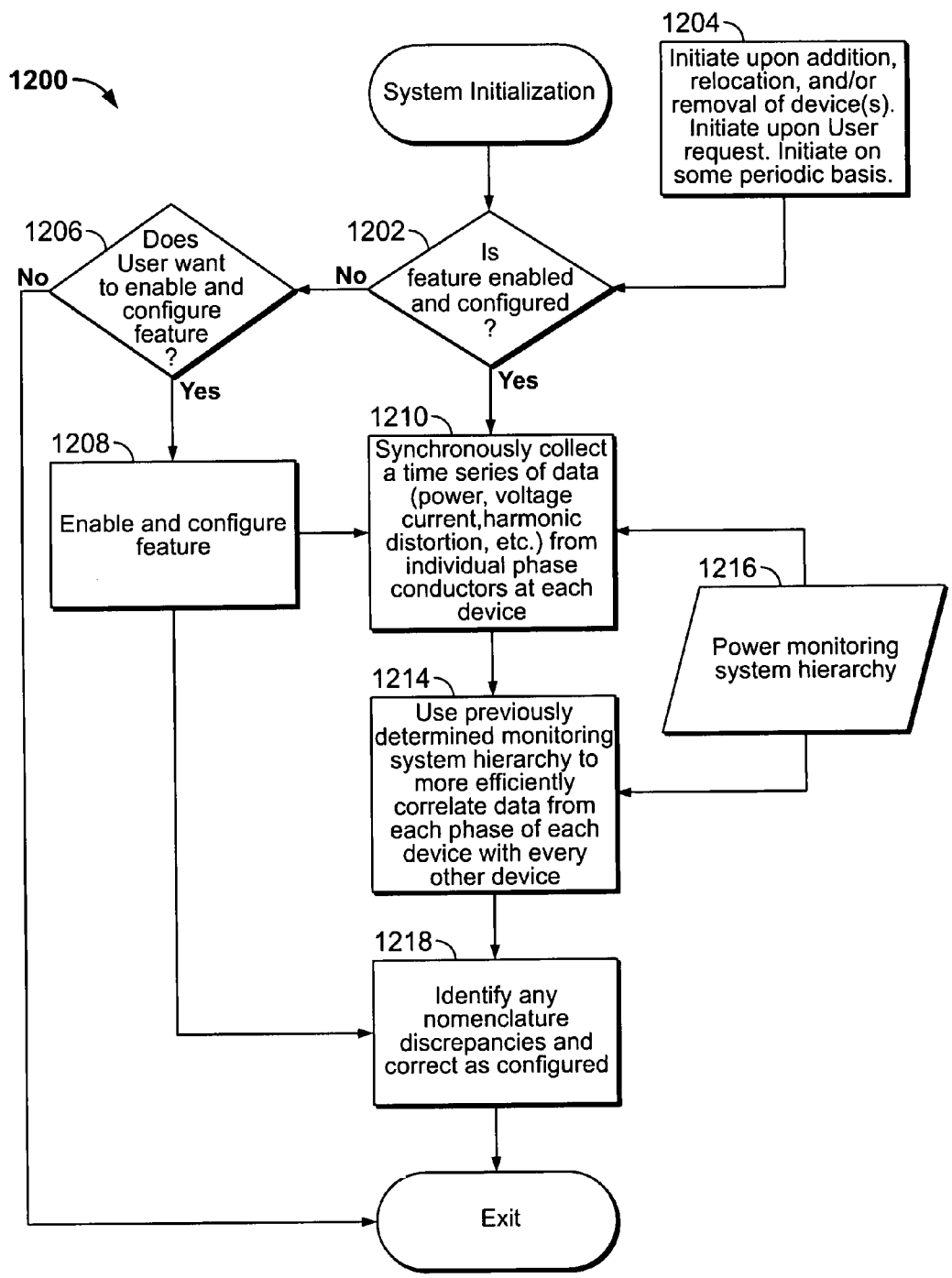
FIG. 12 is a flow chart diagram of a configuration error checking algorithm.

Discrepancies between the phase under analysis for the first monitoring device and the phase associated with the highest correlation factor for the second monitoring device are determined to be nomenclature anomalies, which the software on the host computer 112 flags for corrective action. The software on the host computer 112 can instruct a monitoring device with a mislabeled phase to internally swap data associated with the mislabeled phase (e.g., use Phase A data for Phase B, use Phase B data for Phase C, and use Phase C data for Phase A). This can also be performed in the software at the host computer to eliminate potential confusion and safety issues at the monitoring device in the field. The software on the host computer 112 also reports to the user which phases were swapped for safety purposes. An implementation of this phase nomenclature checking is shown in FIG. 12 and described below.

Individual ground-current measurements from discrete monitoring devices 102 (within a contextual perspective) can help the end-user quickly locate potential issues to minimize hazardous exposure to personnel. For example, improper neutral-ground bonds can be automatically detected and reported to the end-user. Other safety concerns related to electrical codes can be located and the end-user notified.

Benefits of the safety aspects disclosed herein include:
- Quickly and automatically identifying and notifying the end-user of nomenclature problems that can lead to dangerous electrical hazards.
- Quickly identifying, locating, and notifying the end-user of illegal ground-fault sources, which can lead to dangerous electrical hazards.
- Identifying potential electrical code issues or violations.

Distributed Features

Figure 5:
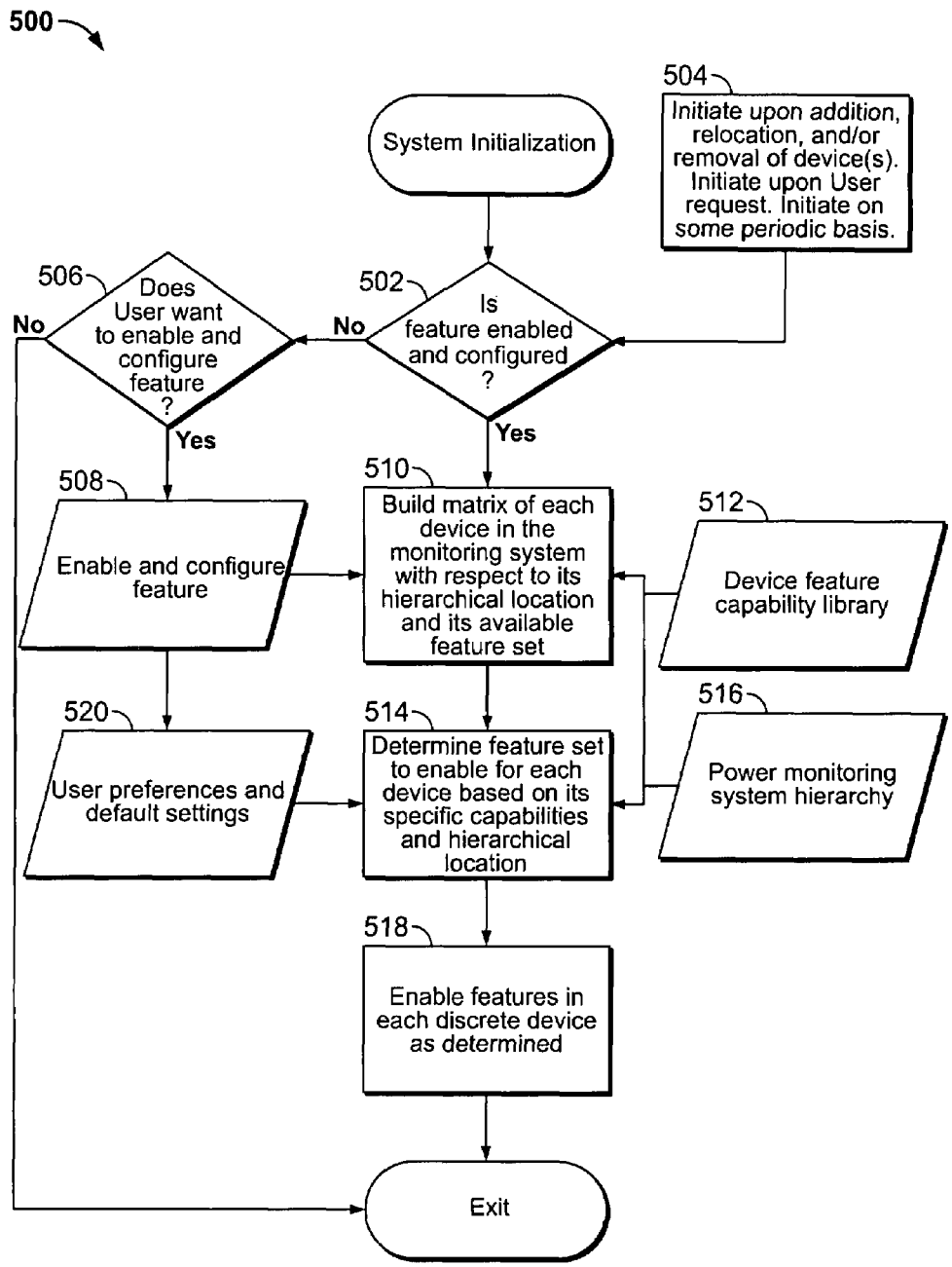
FIG. 5 is a flow chart diagram of a feature distribution algorithm.
Figure 6:
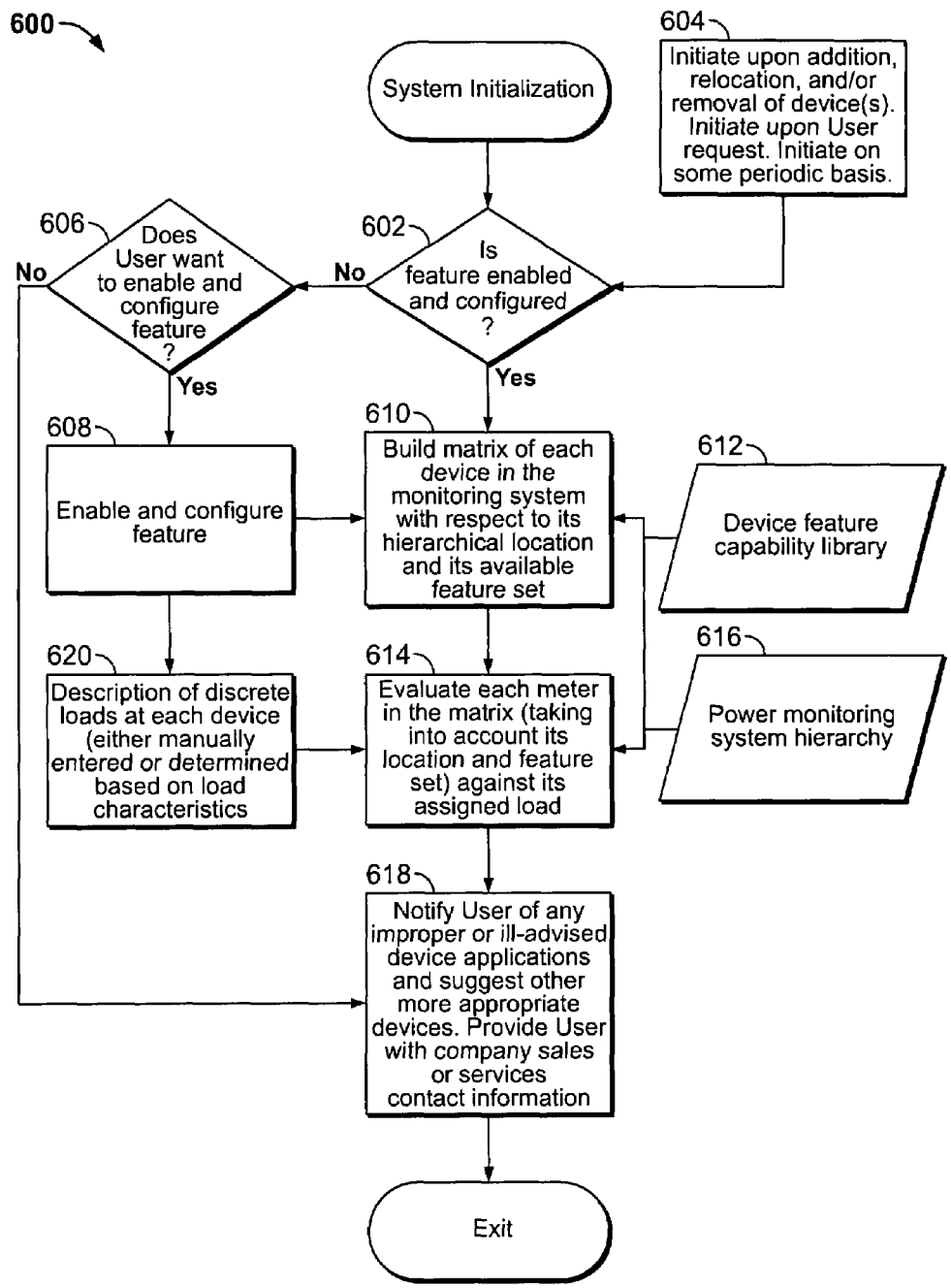
FIG. 6 is a flow chart diagram of an evaluation algorithm.
Figure 7:
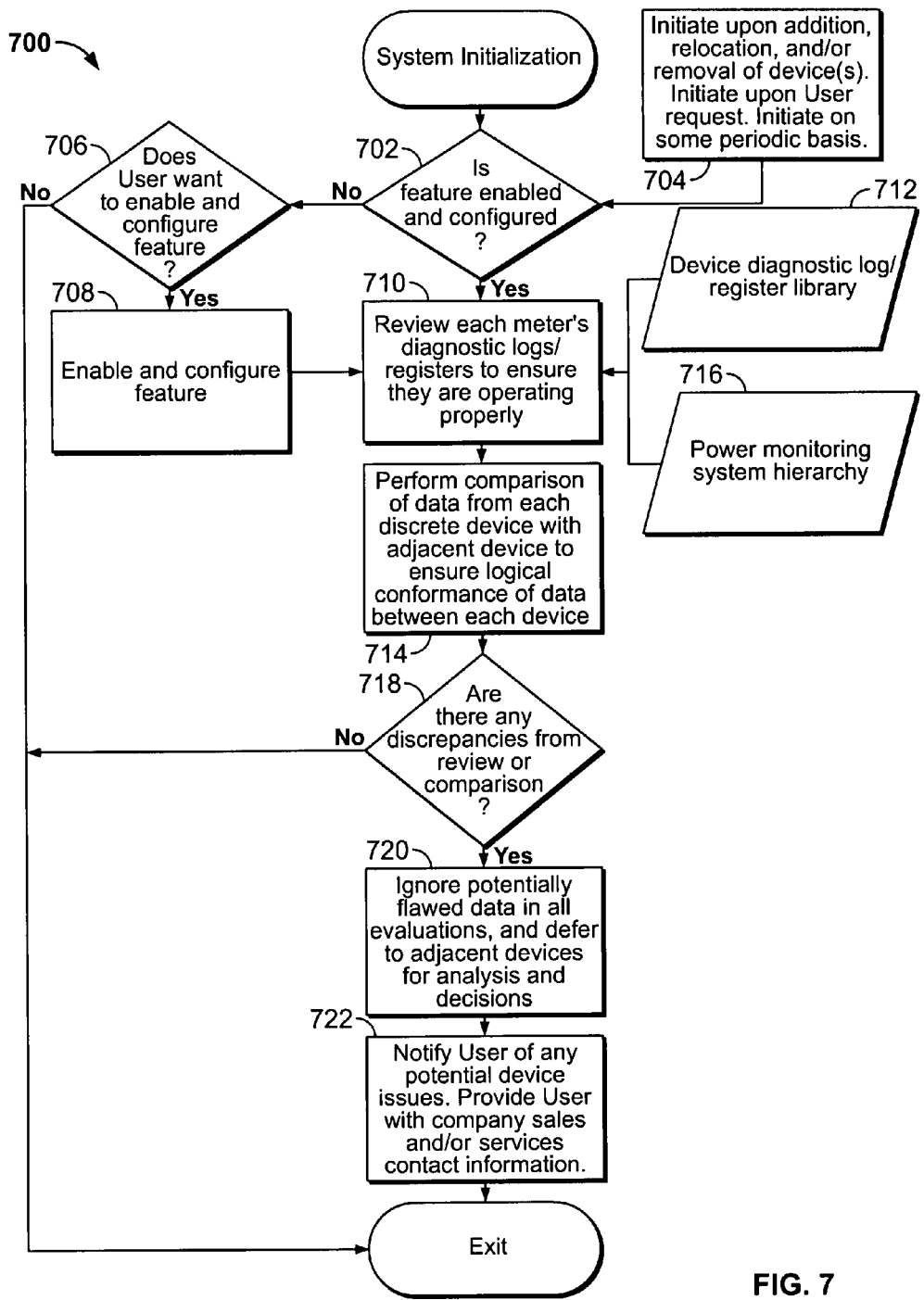
FIG. 7 is a flow chart diagram of a device check algorithm.
Figure 8:
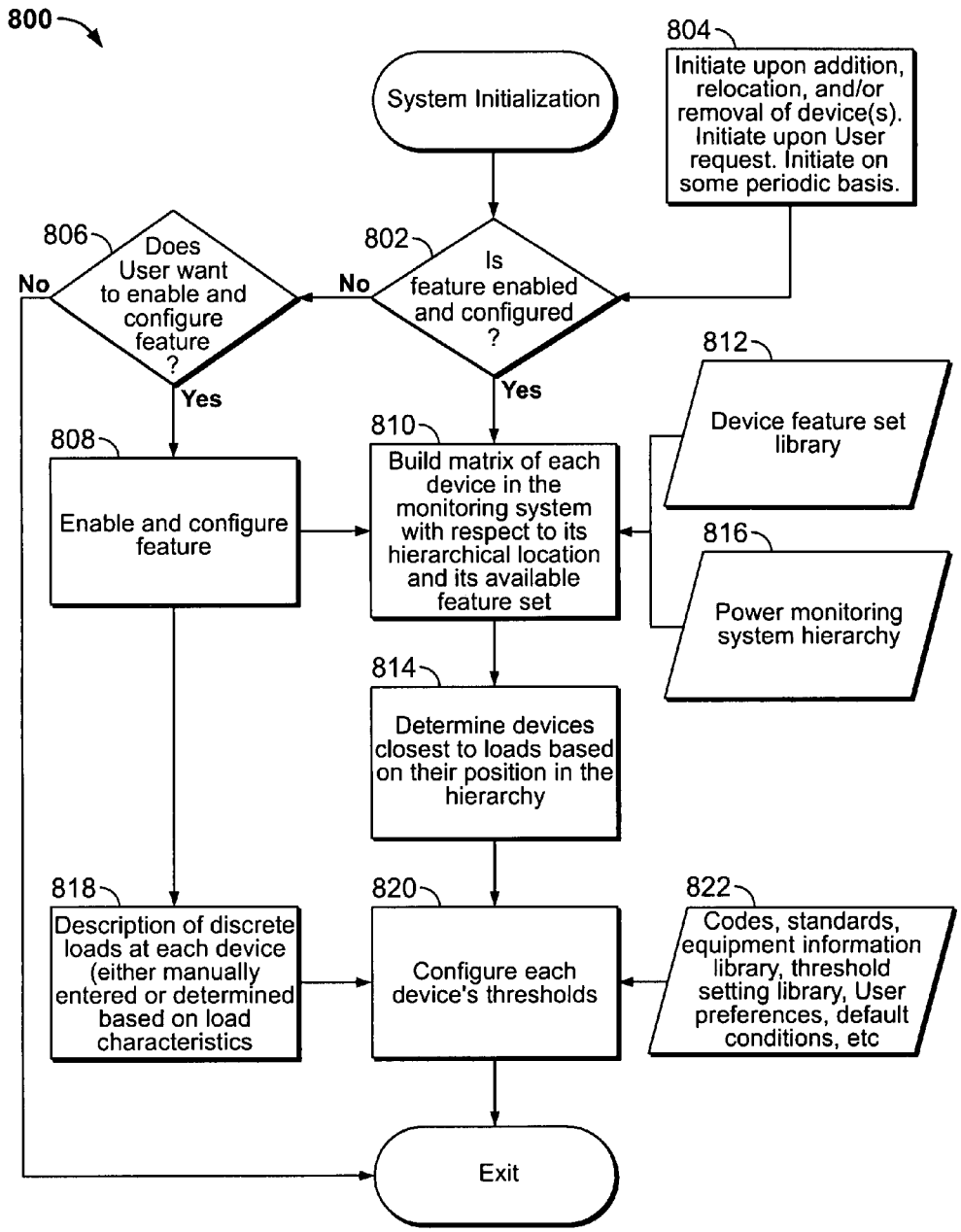
FIG. 8 is a flow chart diagram of a custom configuration algorithm.

Aspects of the present invention allow certain device functionalities and capabilities associated with a monitoring device to be automatically enabled or disabled based on the location of a discrete device within the power monitoring hierarchy (referred to herein as a "distributed feature" in that different feature sets are available in different monitoring devices). A device feature is a feature that is indicative of electrical characteristic data (power, current, voltage, distortion) processed by the controller 134 of the monitoring device 102. The controller 134 is programmed to process the electrical characteristic data to produce special data or an output based on either hardware or firmware capabilities within the device. Non-limiting examples of device features include flicker, transients, unbalance, and harmonic distortion. For example, flicker calculations within a monitoring device 102 require a significant amount of processing bandwidth. However, the flicker calculations may only be of interest at the point of common coupling (PCC) or the main, $M_1$ 102. Flicker-detecting-capable monitoring devices downstream from the main (or PCC) $M_1$ can automatically have the flicker-detecting feature disabled during configuration to minimize the load on the controller 134. This feature can be overridden by the end-user. Reducing the load on a device's controller(s) can allow the monitoring device to have a longer commercial life, thus lengthening the time between design cycles. Feature distribution aspects are described in more detail in connection with FIG. 5 below.

Once the automated configuration system 108 is installed and running on the power monitoring system 100, it is a simple matter for end-users to install a monitoring device in the power monitoring system 100. The end-user need simply to set the PT/CT ratios, scale factors, and the communication information, and then walk away. The distributed feature will carry out the configuration of the monitoring device 102 for the end-user with little required additional input.

Aspects of the present invention greatly reduce the amount of time needed to configure and commission power monitoring systems. Each monitoring device can be custom-configured automatically with minimal input by the end-user, freeing the end-user to focus on other tasks. Power monitoring systems implemented according to aspects of the present invention operate more efficiently, cost less, are less demanding on personnel, increase safety, and subsequently save time and money.

Benefits of the distributed features aspects disclosed herein include:

Reducing the bandwidth required by monitoring devices by distributing (enabling some and disabling others) features as required for the particular power monitoring system.

Facilitating integration of supplemental devices into existing systems.

Freeing manufacturers of monitoring devices and developers of power monitoring software to focus research and development efforts on other tasks.

Improving overall end-user satisfaction.

Automated Configuration Algorithms

Figure 3:
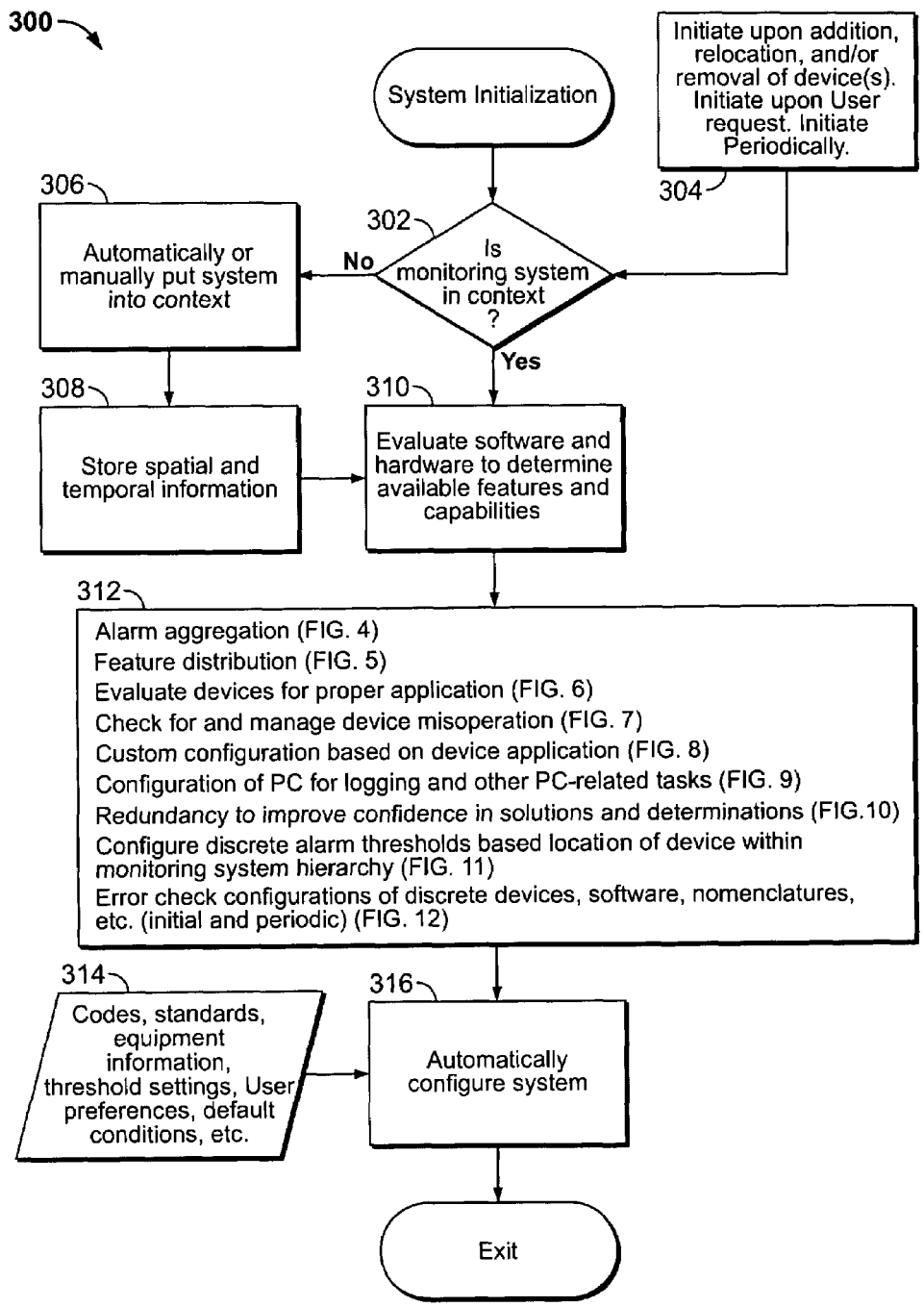
FIG. 3 is a flow chart diagram of an automatic configuration algorithm.
Figure 4:
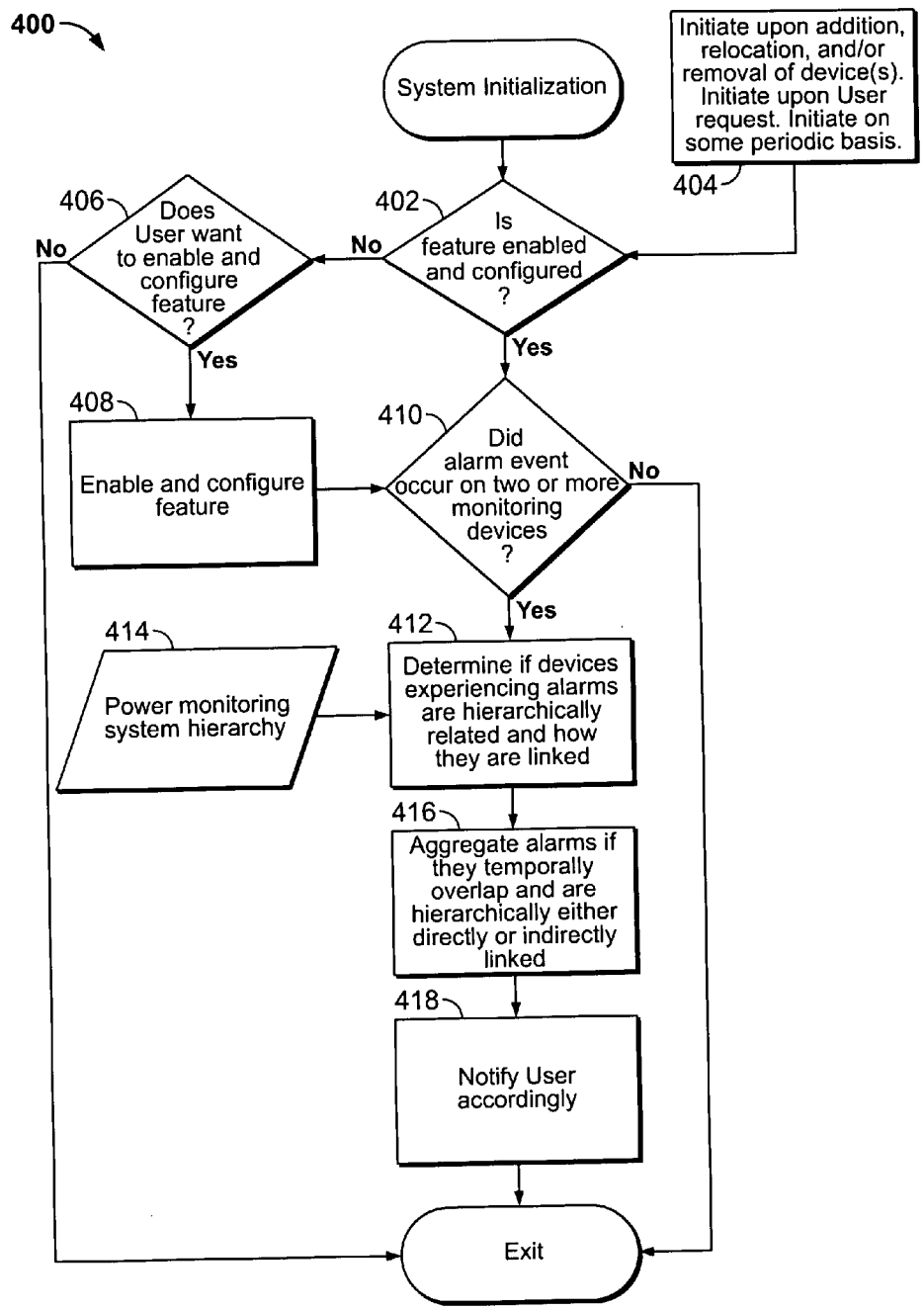
FIG. 4 is a flow chart diagram of an alarm aggregation algorithm.

FIG. 3 is a flow chart diagram of an exemplary automated configuration algorithm 300 according to various aspects of the present invention disclosed herein. FIGS. 4-12 are flow chart diagrams of various algorithms 400, 500, 600, 700, 800, 900, 1000, 1100, 1200 that are shown in block 312. Any combination or all of these algorithms may be carried out by the automated configuration algorithm 300. Where feasible, blocks common to multiple flow chart diagrams share the same last two digits with the reference numbers that appear in FIG. 3, and generally, unless indicated differently, refer to the same step or act that may be carried out by the algorithm under consideration. The machine-executable aspects of these algorithms are stored as software or firmware in the automated configuration module 108 of the host computer 112 in an implementation of the present invention.

Any of these algorithms include machine readable instructions for execution by: (a) a processor, (b) a controller, such as the controller 134, and/or (c) any other suitable processing device. It will be readily understood that the host computer 112 includes such a suitable processing device. Any algorithm disclosed herein may be embodied in software stored on a tangible medium such as, for example, a flash memory, a CD-ROM, a floppy disk, a hard drive, a digital versatile disk (DVD), or other memory devices, but persons of ordinary skill in the art will readily appreciate that the entire algorithm and/or parts thereof could alternatively be executed by a device other than a controller and/or embodied in firmware or dedicated hardware in a well known manner (e.g., it may be implemented by an application specific integrated circuit (ASIC), a programmable logic device (PLD), a field programmable logic device (FPLD), discrete logic, etc.). Also, some or all of the machine readable instructions represented in any flowchart depicted herein may be implemented manually. Further, although specific algorithms are described with reference to flowcharts depicted herein, persons of ordinary skill in the art will readily appreciate that many other methods of implementing the example machine readable instructions may alternatively be used. For example, the order of execution of the blocks may be changed, and/or some of the blocks described may be changed, eliminated, or combined.

Turning now to FIG. 3, upon system initialization, the automated configuration algorithm 300 determines whether the power monitoring system 100 is in context, either in spatial and/or temporal context (302). Put differently, are the spatial relationships of the monitoring devices 102 known and are the respective monitored data by the monitoring devices temporally aligned to a common time reference? As used herein, context refers to spatial context, temporal context, or both. If the power monitoring system 100 is not in context, it is put into context either manually or automatically (306), such as described in U.S. patent application Ser. No. 11/174,100, filed Jul. 1, 2005, entitled "Automated Hierarchy Classification in Utility Monitoring Systems" (spatial context) and U.S. patent application Ser. No. 11/174,099, filed Jul. 1, 2005, entitled "Automated Precision Alignment of Data in a Utility Monitoring System" (temporal context). The spatial and temporal information is stored on the host computer 112 (308). If the power monitoring system 100 is in context, the automated configuration algorithm 300 evaluates the data on the host computer 112 and the monitoring devices 102 to determine which features and capabilities are available for configuration (310). The automated configuration algorithm 300 carries out any one or more of the algorithms listed in block 312. These include: an alarm aggregation algorithm 400 (FIG. 4); a feature distribution algorithm 500 (FIG. 5); an evaluation algorithm 600 (FIG. 6); a device check algorithm 700 (FIG. 7); a custom configuration algorithm 800 (FIG. 8); a host computer configuration algorithm 900 (FIG. 9); a redundancy algorithm 1000 (FIG. 10); an alarm configuration algorithm 1100 (FIG. 1); and a configuration error checking algorithm 1200 (FIG. 12). Each of these algorithms is described in more details in the associated figures that follow.

The configuration algorithm 300 receives stored codes, standards, equipment information, threshold settings, user preferences, default conditions, and the like (314), and may optionally use this information to automatically configure the power monitoring system (316). The configuration algorithm 300 can be invoked upon the addition, relocation, and/or removal of a monitoring device 102 from the power monitoring system 100, upon a request by the end-user of the host computer 112, at startup, or periodically as needed (304).

Alarm Aggregation Algorithm 400

The alarm aggregation algorithm 400 may be initiated upon the addition, relocation, and/or removal of a monitoring device 102 from the power monitoring system 100, upon a request by the end-user of the host computer 112, at startup, or periodically as needed (404). It determines whether the alarm aggregation feature is enabled and configured (402), and, if not, queries whether the end-user wants to enable and configure the feature (406), and, if so, enables and configures the feature (408). The end-user may also state their preferences of certain aspects by manually configuring this feature. The alarm aggregation algorithm 400 determines whether an alarm event occurred on two or more monitoring devices 102 (410). The monitoring devices 102 communicate their respective alarm data to the host computer 112 or to monitoring device M$_1$, which communicates their alarm data to the host computer 112. The alarm data is indicative of an alarm associated with an electrical event detected by the reporting monitoring devices or that at least one threshold setpoint has been exceeded. An electrical event may include any one or more of the following exemplary events: a transient event, a flicker event, a notch event, a voltage or current sag event, a voltage or current swell event, a voltage or current unbalance event, an over frequency event, an under frequency event, or a peak demand event.

The alarm aggregation algorithm 400 receives a representation of the hierarchy (which can be determined manually or automatically) of the power monitoring system 100 (414), and determines whether the monitoring devices that detected the alarm are hierarchically linked and how they are linked (412). The hierarchy can be determined manually or automatically. The algorithm 400 determines whether the alarm data from the reporting monitoring devices were triggered within the same time period (e.g., they are in temporal proximity to each other) and are linked either directly or indirectly in the hierarchy of the power monitoring system 100 (e.g., they are spatially related) (416). If so, those alarms are aggregated together to form an aggregated alarm that can be a single alarm. The algorithm 400 stores aggregated alarm data indicative of the aggregated alarm and reports the aggregated alarm by causing a representation of the aggregated alarm to be displayed on a video display of the host computer 112 or otherwise conveyed to the end-user (418).

The aggregation reduces the total number of alarms that are reported to the end-user, thus reducing confusion and inundation. For example, multiple monitoring devices linked together in the hierarchy may detect the same electrical event, alarm on the same event, and report their alarm data to the host computer 112 simultaneously. The sheer volume of alarm data can be overwhelming to the end-user. The alarm aggregation algorithm 400 automatically aggregates, based upon the respective positions within the hierarchy of the power monitoring system 100 of the monitoring devices 102 (and on the temporal position of the alarm at each respective monitoring device) that reported the alarm event, common alarms together into a single alarm or a reduced number of alarms and reports only the aggregated alarm to the end-user, reducing the amount of information the end-user needs to process and analyze during an alarm event. In a specific example, a single voltage sag may result in six alarms from one monitoring device alone, because alarms will be generated for the pickup and dropout points for each of the three phases being monitored. The number of alarms is then multiplied by the number of monitoring devices that detected the same voltage sag. In this example, the alarm aggregation algorithm 400 combines all of the pickup alarms, dropout alarms for all of the phases across all devices that perceives the voltage sag and aggregates them into a single alarm.

Feature Distribution Algorithm 500

The feature distribution algorithm 500 may be initiated upon the addition, relocation, and/or removal of a monitoring device 102 from the power monitoring system 100, upon a request by the end-user of the host computer 112, upon startup, or periodically as needed (504). It determines whether the feature distribution is enabled and configured (502), and, if not, queries whether the end-user wants to enable and configure the feature (506), and, if so, enables and configures the feature (508). The feature distribution algorithm builds a matrix of each monitoring device 102 in the power monitoring system 100 with respect to its hierarchical location and its available device feature set (510). Feature sets may include device features such as the monitoring of flicker, transients, harmonic distortion, voltage sag detection, adaptive waveform capture, etc. The matrix is stored in a memory of the host computer 112. A library of device feature capabilities 512 (e.g., what is some specific device's capabilities) is accessed by the algorithm 500 along with a representation of the hierarchy of the power monitoring system 516, which may be determined manually or automatically. User preferences and default settings 520 are also accessible by the algorithm 500. The algorithm 500 determines which feature set to enable for each monitoring device 102 based upon its specific capabilities and its location in the hierarchy (514).

For example, a monitoring device may have the capability to detect flicker, transient events, and harmonic distortion, but carrying out all of these capabilities is not necessary for all monitoring devices throughout the hierarchy. Utilizing precious bandwidth to perform these features can be unnecessary for certain monitoring devices depending upon their location within the hierarchy. For example, it may be desirable to monitor the harmonic distortion for each frequency component on a feeder, but at the main, it may be desirable to monitor only total harmonic distortion. Likewise, flicker measurement may be desirable at the main metering point while disabling it downstream in the hierarchy. Upon disabling flicker on downstream monitoring devices, they may focus their bandwidth on harmonic distortion detection, offering higher precision on harmonic distortion detection at the expense of flicker detection. If it is determined that more than one monitoring device is on a single electrical bus, then some voltage-related readings (fundamental, harmonic distortion, sags, swells, etc.) may be redundant. This feature uses information from one device and disables it in others because to use their information would be redundant.

The algorithm 500 enables the features in each discrete monitoring device as determined (518). In a specific implementation, the algorithm 500 produces a first set of device features of one of the monitoring devices 102 by selectively enabling some of that device's features and disabling others features based upon the location of that device in the hierarchy. The algorithm 500 also produces a second set of device features of another monitoring device 102 by selectively enabling some of that device's features and disabling others based upon the location of that monitoring device in the hierarchy. The second set of device features may differ from the first set of device features. In this way, the feature distribution algorithm 500 can configure different monitoring devices 102 to carry out different combinations of features based upon their respective locations within the power monitoring system 100 and/or relative to one another.

Evaluation Algorithm 600

The evaluation algorithm 600 may be initiated upon the addition, relocation, and/or removal of a monitoring device 102 from the power monitoring system 100, upon a request by the end-user of the host computer 112, upon startup, or periodically as needed (604). It determines whether the evaluation feature is enabled and configured (602), and, if not, queries whether the end-user wants to enable and configure the feature (606), and, if so, enables and configures the feature (608). A library of device feature capabilities 612 is accessed by the algorithm 600 along with a representation of the hierarchy of the power monitoring system 616, which may be determined manually or automatically. The algorithm 600 builds a matrix of each monitoring device 102 in the power monitoring system 100 with respect to its location in the hierarchy and its available feature set (610). The algorithm 600 receives a description of discrete loads connected to each monitoring device 102 (620). These descriptions can be entered manually or determined automatically based upon the characteristics of the discrete loads. Each monitoring device 102 in the matrix is evaluated as a function of its location in the hierarchy and feature set against its assigned load (614). Any anomalies are reported to the end-user as improper or ill-advised device applications, and the algorithm 600 may suggest more appropriate devices (618).

For example, a high-end monitoring device may be connected to a load, which has capabilities and features that are more advanced than needed for that specific load. The algorithm 600 determines where the high-end monitoring device is spatially located in the hierarchy and that it is connected to a load. The algorithm 600 also knows the characteristics of the load (e.g., non-linear loads that generate specific harmonic distortion, motors that have a current inrush signature, etc.), and in the evaluation block (614), determines that the high-end monitoring device is more advanced than what is needed at that monitoring point and suggests another lower-end monitoring device be installed instead. Likewise, if a low-end monitoring device is installed at a main metering point in the hierarchy, the algorithm 600 may suggest that a higher-end monitoring device be installed to offer enhanced reporting and monitoring of the main. By way of another example, if a monitoring device that is not capable of carrying out the Fourier analysis needed to quantify discrete harmonic distortion is connected to a load that generates harmonic distortion, the algorithm 600 may suggest another monitoring device that has that capability. In conjunction with the feature distribution algorithm 500, the algorithm 300 may also automatically enable or disable device features when a remedial device is installed.

Device Check Algorithm 700

The device check algorithm 700 may be initiated upon the addition, relocation, and/or removal of a monitoring device 102 from the power monitoring system 100, upon a request by the end-user of the host computer 112, upon startup, or periodically as needed (704). It determines whether the device check feature is enabled and configured (702), and, if not, queries whether the end-user wants to enable and configure the feature (706), and, if so, enables and configures the feature (708). A device diagnostic log/register library 712 is accessed by the algorithm 700 along with a representation of the hierarchy of the power monitoring system 716, which may be determined manually or automatically. Each monitoring device's diagnostic logs and registers are evaluated by the algorithm 700 to ensure that the monitoring device is operating properly. For example, if the monitoring device 102 is configured for on-board data logging but the device's diagnostic log indicates that there is a malfunction of the on-board data logging feature, the end-user will be notified. The diagnostics logs include data such as the number of times when the monitoring device is reset, the number of instances of loss of frequency lock, and so forth. This diagnostic information can be examined to determine whether the monitoring device 102 is operating properly.

The algorithm 700 compares data being monitored by each discrete monitoring device with each adjacent (or linked in the hierarchy) monitoring device to ensure logical conformance of the data between the monitoring devices (714). For example, if a suspect monitoring device starts reading a negative energy flow, the algorithm 700 analyzes data from other linked monitoring devices to conclude whether the suspect monitoring device is not operating properly. Another example ensures logical conformance among monitoring devices that are capable of disturbance direction detection. If a suspect monitoring device repeatedly reports a disturbance direction that differs from the direction reported by linked monitoring devices, there may be an operational or configuration problem with that suspect monitoring device. Still another example compares power consumption values. Yet another example of non-conformance occurs when multiple monitoring devices are known to be on the same bus but produce different voltage readings. If a monitoring device reports a value for power consumption that is higher than a device that is supposed to be immediately upstream in the power monitoring system 100 hierarchy, this discrepancy would indicate an error in one of the monitoring devices 102 or in the hierarchy of the power monitoring system 100. If there are any discrepancies from this comparison (718), the algorithm 700 ignores potentially flawed data from the monitoring device under consideration in all evaluations and instead defers to adjacent monitoring devices (preferably those directly linked in the hierarchy to the monitoring device under consideration) for analysis and decisions (720). The end-user is also notified of any potential issues with the monitoring device, which will allow the end-user to check the monitoring device reporting the flawed data and inspect or replace it if necessary (722). The algorithm 300 runs the device check algorithm 700 when the replacement monitoring device is installed (704), and if the monitoring device is operating properly, the previously ignored data is now recognized for analysis and decisions.

Custom Configuration Algorithm 800

The custom configuration algorithm 800 may be initiated upon the addition, relocation, and/or removal of a monitoring device 102 from the power monitoring system 100, upon a request by the end-user of the host computer 112, upon startup, or periodically as needed (804). It determines whether the custom configuration feature is enabled and configured (802), and, if not, queries whether the end-user wants to enable and configure the feature (806), and, if so, enables and configures the feature (808). A device feature set library 812 is accessed by the algorithm 800 along with a representation of the hierarchy of the power monitoring system 816, which may be determined manually or automatically.

The algorithm 800 builds a matrix of each monitoring device in the power monitoring system 100 with respect to its location in the hierarchy and available feature set (810). The algorithm 800 determines which monitoring devices are closest to the loads based upon their position in the hierarchy (814). The algorithm 800 accesses a description of discrete loads connected to each monitoring device (818). The description can be entered manually or automatically determined based upon the discrete load characteristics. Each monitoring device's thresholds are configured (820) with input from codes, standards, equipment information, threshold settings, user preferences, default conditions, and other information (822)

In an implementation, the algorithm 800 automatically determines which monitoring devices are connected to a load to produce a set of load-connected monitoring devices. To do so, the algorithm 800 determines the location of each of the load-connected monitoring devices in the hierarchy, which are typically the monitoring devices located on the bottom of the hierarchy. The algorithm 800 retrieves configuration parameters associated with each of the load-connected monitoring devices. The configuration parameters include a threshold of an electrical characteristic (power, current, voltage, distortion) monitored by the associated load-connected monitoring device. The algorithm 800 configures a first load-connected monitoring device according to a first set of configuration parameters and stores data indicative of the first set of configuration parameters in a memory of the first load-connected monitoring device. The algorithm 800 configures a second load-connected monitoring device according to a second set of configuration parameters that differs from the first set of configuration parameters. The algorithm 800 stores data indicative of the second set of configuration parameters in a memory of the second load-connected monitoring device.

Host Computer Configuration Algorithm 900

The host computer configuration algorithm 900 may be initiated upon the addition, relocation, and/or removal of a monitoring device 102 from the power monitoring system 100, upon a request by the end-user of the host computer 112, upon startup, or periodically as needed (904). It determines whether the host computer configuration feature is enabled and configured (902), and, if not, queries whether the end-user wants to enable and configure the feature (906), and, if so, enables and configures the feature (908). A device feature capability library 912 is accessed by the algorithm 900 along with a representation of the hierarchy of the power monitoring system 916, which may be determined manually or automatically.

Figure 9:
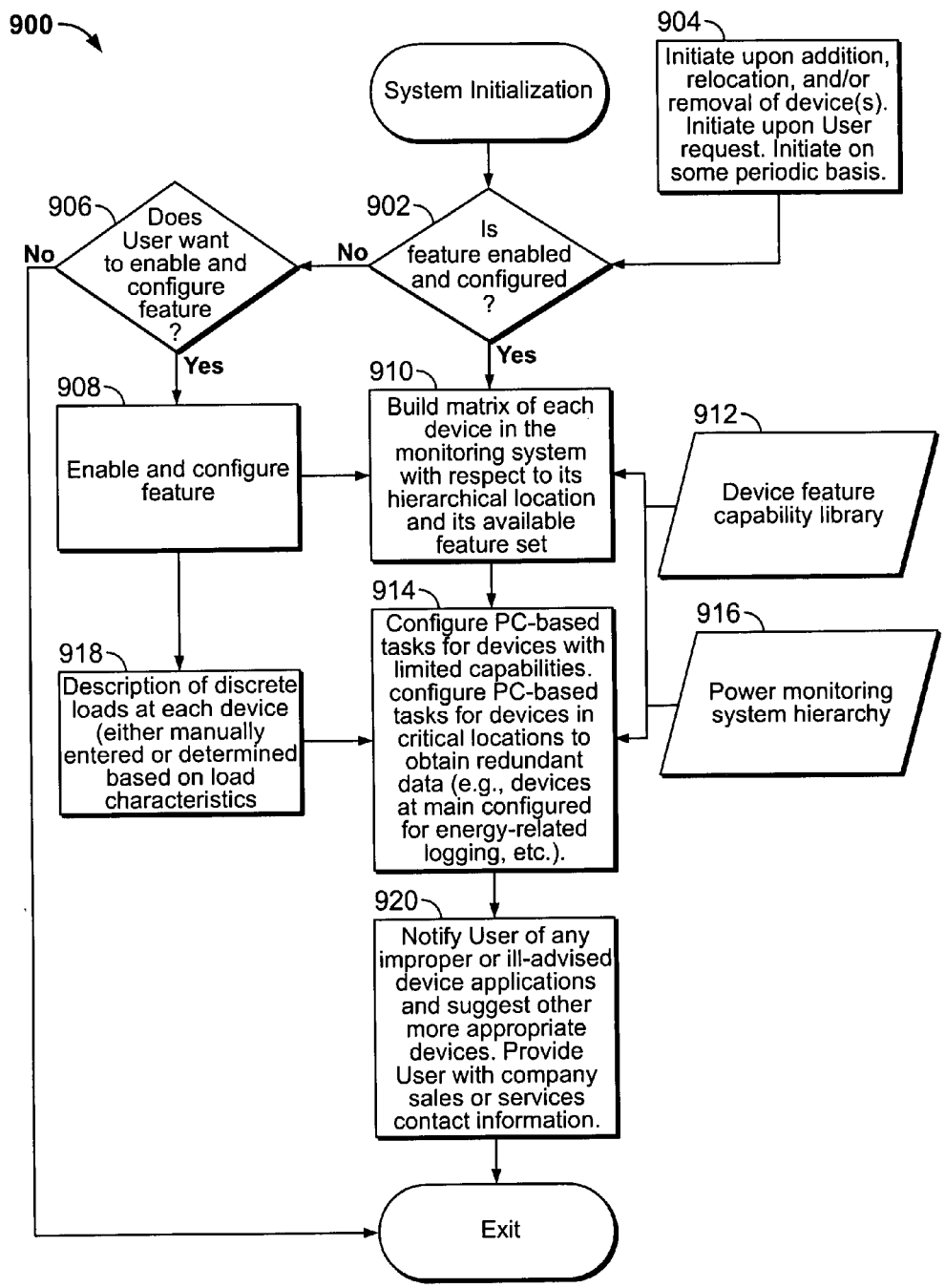
FIG. 9 is a flow chart diagram of a host computer configuration algorithm.
Figure 10:
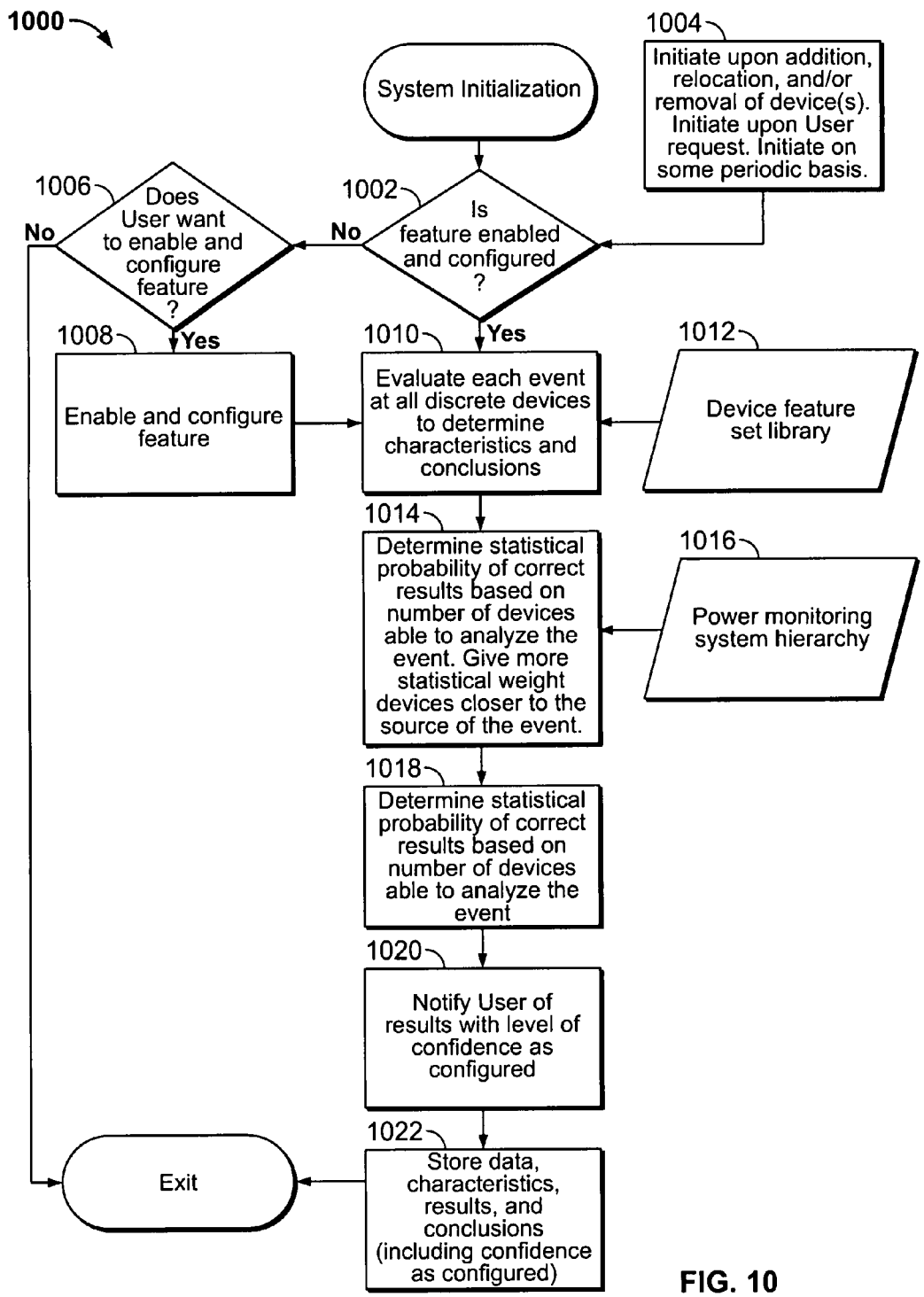
FIG. 10 is a flow chart diagram of a redundancy algorithm.
Figure 11:
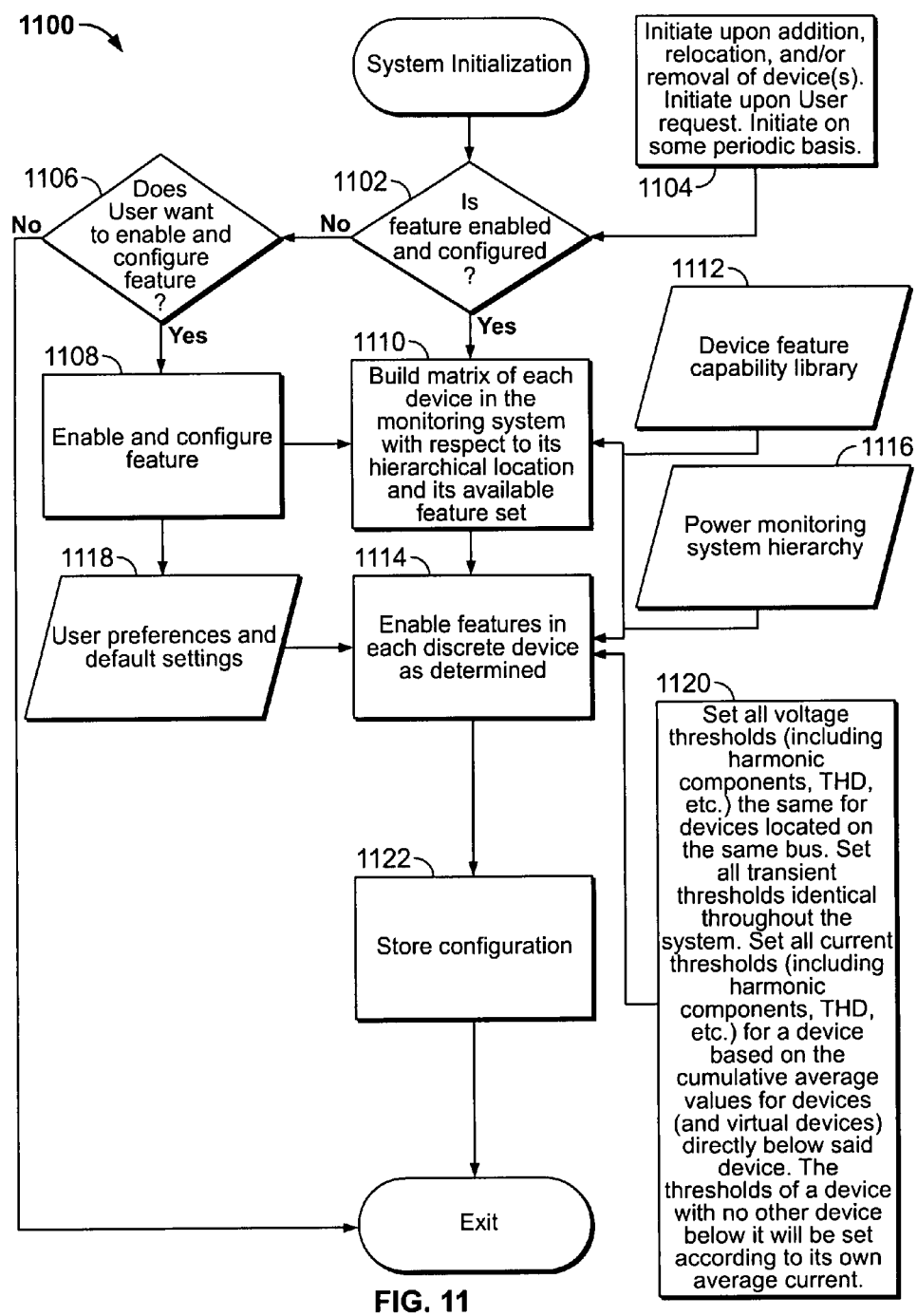
FIG. 11 is a flow chart diagram of an alarm configuration algorithm.

The algorithm 900 builds a matrix of each monitoring device in the power monitoring system 100 with respect to its location in the hierarchy and available feature set (910). The algorithm 900 configures computer-based tasks for monitoring devices with limited capabilities (914). For example, some monitoring devices do not have the capability to log and store monitored data. The host computer 112 can poll registers in such monitoring devices periodically and build a log file that is stored at the host computer 112. The algorithm 900 configures computer-based tasks for monitoring devices at critical locations (e.g., monitoring devices at the main monitoring point configured for energy-related logging) in the hierarchy to obtain redundant data (914). The algorithm 900 notifies the end-user of any improper or ill-advised device applications and suggests more appropriate devices (920). In FIG. 9, "PC" (personal computer) can refer to the host computer 112.

Redundancy Algorithm 1000

The redundancy algorithm 1000 may be initiated upon the addition, relocation, and/or removal of a monitoring device 102 from the power monitoring system 100, upon a request by the end-user of the host computer 112, upon startup, or periodically as needed (1004). It determines whether the redundancy feature is enabled and configured (1002), and, if not, queries whether the end-user wants to enable and configure the feature (1006), and, if so, enables and configures the feature (908). A device feature set library 1012 is accessed by the algorithm 1000 along with a representation of the hierarchy of the power monitoring system 1016, which may be determined manually or automatically.

The algorithm 1000 evaluates each electrical event (e.g., a transient event, a flicker event, a notch event, a voltage or current sag event, a voltage or current swell event, a voltage or current unbalance event, or a peak demand event) or each set threshold that is exceeded, such as energy demands, energy consumptions, power factor, etc., at all discrete monitoring devices to determine characteristics and conclusions (1010). The algorithm 1000 determines the statistical probability that the monitoring device has correctly detected the event based on the number of monitoring devices that were able to analyze the event (1018). The algorithm 1000 assigns more statistical weight to monitoring devices closer to the source of the event (1014). The algorithm 1000 notifies the end-user a level of confidence in the results as configured (1020). The algorithm 1000 stores the data, characteristics, results, and conclusions (including the confidence level as configured) (1022).

According to an implementation, the algorithm 1000 receives result data from a set of monitoring devices responsive to an electrical event. The result data indicates a characteristic of the electrical event (such as the type of electrical event, a magnitude, a duration, or a periodicity) or of the threshold that was exceeded, such as energy demands, energy consumptions, power factor, etc. The algorithm 1000 determines a level of confidence in the result data by (1) assigning a relatively higher statistical weight to those monitoring devices proximal to the source of the electrical event compared to those monitoring devices distal from the source and (2) determining a statistical probability of the characteristic of the electrical event or the threshold that was exceeded based on the number of monitoring devices in the set of monitoring devices. The algorithm 1000 stores data indicative of the level of confidence in a memory.

Alarm Configuration Algorithm 1100

The alarm configuration algorithm 1100 may be initiated upon the addition, relocation, and/or removal of a monitoring device 102 from the power monitoring system 100, upon a request by the end-user of the host computer 112, upon startup, or periodically as needed (1104). It determines whether the alarm configuration feature is enabled and configured (1102), and, if not, queries whether the end-user wants to enable and configure the feature (1106), and, if so, enables and configures the feature (1108). A device feature capability library 1112 is accessed by the algorithm 1100 along with a representation of the hierarchy of the power monitoring system 1116, which may be determined manually or automatically, and user preferences and default settings 1118.

The algorithm 1100 builds a matrix of each monitoring device in the monitoring system 100 with respect to its location in the hierarchy and available feature set (1110). The algorithm 1100 enables features in each monitoring device as determined (1114). Examples of features that may be set are shown in block 1120. The configuration is stored (1122).

Configuration Error Checking Algorithm 1200

The configuration error checking algorithm 1200 may be initiated upon the addition, relocation, and/or removal of a monitoring device 102 from the power monitoring system 100, upon a request by the end-user of the host computer 112, upon startup, or periodically as needed (1204). It determines whether the configuration error checking feature is enabled and configured (1202), and, if not, queries whether the end-user wants to enable and configure the feature (1206), and, if so, enables and configures the feature (1208). A representation of the hierarchy of the power monitoring system 1216, which may be determined manually or automatically, is accessed by the algorithm 1200.

The algorithm 1200 synchronously collects a time series of electrical characteristic data (power, power factor, voltage, current, frequency, harmonic distortion, and the like) from individual phase conductors at each monitoring device (1210). The algorithm 1200 uses the previously determined power monitoring system hierarchy to more efficiently correlate data from each phase of each device with every other device (1214). The algorithm 1200 identifies any phase nomenclature discrepancies and corrects as configured (1218). Additional aspects of this algorithm 1200 are discussed above under the Safety section.

While particular embodiments and applications of the present invention have been illustrated and described, it is to be understood that the invention is not limited to the precise construction and compositions disclosed herein and that various modifications, changes, and variations can be apparent from the foregoing descriptions without departing from the spirit and scope of the invention as defined in the appended claims.

What is claimed is:

1. A method of automatically configuring a power monitoring system for alarm aggregation, comprising:
   storing a representation of a hierarchy in a memory, said hierarchy being indicative of how a plurality of monitoring devices are logically linked to one another in said power monitoring system;
   receiving, from at least two of said monitoring devices, respective alarm data indicative of an electrical characteristic being exceeded, said electrical characteristic being monitored by respective ones of said at least two monitoring devices;
   determining whether said alarm data from each of said at least two monitoring devices were triggered within the same time period and whether said at least two monitoring devices are linked together in said hierarchy;
   responsive to said alarm data from each of said at least two monitoring devices being triggered within a predetermined time period and responsive to said at least two monitoring devices being linked together in said hierarchy, automatically aggregating said alarm data from said at least two monitoring devices to form an aggregated alarm;
   storing aggregated alarm data indicative of said aggregated alarm; and
   communicating a representation of said aggregated alarm.

2. The method of claim 1, further comprising automatically determining said hierarchy.

3. The method of claim 2, wherein said automatically aggregating is carried out responsive to said at least two monitoring devices being indirectly linked together in said hierarchy.

4. The method of claim 2, wherein said automatically aggregating reduces the total number of alarms reported.

5. The method of claim 4, wherein said automatically aggregating causes said alarms provided by said at least two monitoring devices to be treated as a single alarm.

6. The method of claim 2, wherein said alarm data is indicative of an electrical event, said time period expiring upon the expiration of said electrical event.

7. A method for location-based customized configuration of a power monitoring system, comprising:
   storing a representation of a hierarchy in a memory, said hierarchy being indicative of how a plurality of monitoring devices are linked to one another in said power monitoring system;
   automatically determining which of said plurality of monitoring devices are connected to a load to produce a set of load-connected monitoring devices by determining the location of each of said set of load-connected monitoring devices in said hierarchy;
   retrieving respective configuration parameters associated with each of said set of load-connected monitoring devices, said configuration parameters including an alarm threshold of an electrical characteristic monitored by said associated load-connected monitoring device;
   configuring a first of said set of load-connected monitoring devices according to a first of said configuration parameters;
   storing data indicative of said first of said configuration parameters in a memory of said first of said set of load-connected monitoring devices;
   configuring a second of said set of load-connected monitoring devices according to a second of said configuration parameters that differs from said first of said configuration parameters; and
   storing data indicative of said second of said configuration parameters in a memory of said second of said set of load-connected monitoring devices.

8. The method of claim 7, further comprising automatically determining said hierarchy.

9. The method of claim 7, wherein said plurality of monitoring devices each include a plurality of device features indicative of electrical characteristic data processed by a controller of said monitoring device, the method further comprising:
   producing a first set of device features of one of said plurality of monitoring devices by selectively enabling some of said devices features of said one of said plurality of monitoring devices and disabling others of said device features of said one of said plurality of monitoring devices based upon the location of said one of said plurality of monitoring devices in said hierarchy; and
   producing a second set of device features of another one of said plurality of monitoring devices by selectively enabling some of said device features of said another one of said plurality of monitoring devices and disabling others of said devices features of said another one of said plurality of monitoring devices based upon the location of said another one of said plurality of monitoring devices in said hierarchy, wherein said second set of device features differs from said first set of device features.

10. The method of claim 9, wherein said producing said first set of device features including receiving an input from a user indicative of which, if any, of said device features of said one of said plurality of monitoring devices to be enabled and which, if any, of said device features of said one of said plurality of monitoring devices to be disabled.

11. The method of claim 9, wherein said device features include at least one of flicker, transients, harmonic distortion, unbalance, voltage sags/swells, current sags/swells, voltage/current unbalance, or peak demands, and wherein said electrical characteristic data includes at least one of power, power factor, voltage, current, frequency, or distortion.

12. A method of automatically configuring a power monitoring system for redundant verification of an electrical event experienced on an electrical system monitored by said power monitoring system, comprising:
   storing a representation of a hierarchy in a memory, said hierarchy being indicative of how a plurality of monitoring devices are linked to one another in said power monitoring system;
   receiving result data from a set of said plurality of monitoring devices responsive to said electrical event, said result data indicating a characteristic of said electrical event;
   determining a level of confidence in said result data by:
      assigning a relatively higher statistical weight to those of said set of monitoring devices proximal to the source of said electrical event compared to those of said set of monitoring devices distal from said source, and
      determining a statistical probability of said characteristic of said electrical event based on the number of monitoring devices in said set of monitoring devices; and
   storing data indicative of said level of confidence.

13. The method of claim 12, further comprising automatically determining said hierarchy.

14. The method of claim 13, wherein said electrical event includes at least one of a transient event, a flicker event, a notch event, a voltage or current sag event, a voltage or current swell event, a voltage or current unbalance event, an over frequency event, an under frequency event, or a peak demand event, and said characteristic of said electrical event includes at least one of a type of electrical event, a magnitude, a duration, or a periodicity.

* * * * *